(12) United States Patent 
Maurer

(10) Patent No.: US 7,454,866 B2
(45) Date of Patent: Nov. 25, 2008

(54) FAçADE COVERING

(75) Inventor: Ingo Maurer, München (DE)

(73) Assignee: Ingo Maurer GmbH (DE)

( * ) Notice: Subject to any disclaimer, the term of this patent is extended or adjusted under 35 U.S.C. 154(b) by 0 days.

(21) Appl. No.: 11/493,735

(22) Filed: Jul. 26, 2006

(65) Prior Publication Data

US 2006/0283116 A1 Dec. 21, 2006

Related U.S. Application Data

(63) Continuation of application No. PCT/EP2004/014865, filed on Dec. 30, 2004.

(30) Foreign Application Priority Data

Jan. 26, 2004 (DE) ........................ 10 2004 003 880

(51) Int. Cl.
*E04H 1/00* (2006.01)
(52) U.S. Cl. .............................. 52/235; 52/384; 52/385
(58) Field of Classification Search .................. 52/235, 52/384, 385; 40/544
See application file for complete search history.

(56) References Cited

U.S. PATENT DOCUMENTS

| 3,721,762 | A | * | 3/1973 | Gooding ..................... 174/504 |
| 4,636,441 | A | * | 1/1987 | Sirinyan et al. ............. 428/447 |
| 6,764,196 | B2 | * | 7/2004 | Bailey ........................ 362/147 |
| 6,987,312 | B2 | * | 1/2006 | Theuss ....................... 257/680 |
| 7,190,390 | B2 | * | 3/2007 | Hett et al. ..................... 348/58 |

FOREIGN PATENT DOCUMENTS

| DE | 42 00 879 A1 | 7/1993 |
| DE | 100 19 315 A1 | 5/2001 |
| DE | 100 45 629 A1 | 11/2002 |
| DE | 202 15 510 U1 | 10/2003 |
| EP | 1 256 687 | 11/2002 |
| WO | WO 2004/048736 G | 6/2004 |

* cited by examiner

*Primary Examiner*—Basil Katcheves
(74) *Attorney, Agent, or Firm*—Mayback & Hoffman, P.A.; Gregory L. Mayback; Scott D. Smiley

(57) ABSTRACT

A façade covering for covering an outer wall of a building comprises a plurality of façade covering boards formed by circuit boards mountable to the outer wall of the building.

9 Claims, 1 Drawing Sheet

FAÇADE COVERING

CROSS-REFERENCE TO RELATED APPLICATION

This application is a continuation of copending International Application No. PCT/EP2004/014865, filed Dec. 30, 2004, which designated the United States and was not published in English.

BACKGROUND OF THE INVENTION

1. Field of the Invention

The present invention relates to façade covering. Particularly, the present invention relates to façade covering for covering an outer wall of a building with a plurality of façade covering boards mountable to the outer wall of the building.

2. Description of the Related Art

It is common to provide the outer walls of a building, such as a house, with façade covering.

In the field of detached houses, the outer wall facing the exposed side is often provided with a covering, which, in the simplest case, consists of a plurality of carrier boards, whereon prefabricated concrete fiber boards or asbestos boards are deposited, which are then painted with façade paint. The optical impression of such a board façade is not satisfying.

Modern multistory building façades are commonly provided with façade coverings consisting of metal carrier constructions, in which the windows of the building are inserted. Wall areas between the windows as well as those façade areas covering the respective corner constructions, commonly consists of anodized aluminum boards of covered metal boards. Such façade coverings are usually not very attractive, or sometimes even slightly dreary. Façades formed by closed aluminum board constructions are often also problematic with regard to the room climate, since such wall constructions allow no passage of air, so that buildings with such wall constructions depend on effective inside ventilation to avoid moisture depositions and condensations in the region of the façade walls. Finally, such façade constructions are comparatively expensive.

The type of façade covering common in rural areas consists of wood elements or wood panels attached via a wood lath carrier. This type of façade covering might not fulfill all architectural requirements, but allows so-called breathing of the walls of the building, which means a passage of moisture from the inside of the house provided with such a façade covering through the brick wall and the wood panels to the ambient atmosphere. Further, such a wood façade covering is comparatively cheap.

SUMMARY OF THE INVENTION

It is an object of the present invention to provide a weatherproof façade covering having an optically attractive surface design.

The present invention provides a façade covering for covering an outer wall of a building with a plurality of façade covering boards mountable at the outer wall of the building, characterized in that the façade covering boards are circuit boards, each having an epoxide carrier.

According to the present invention, the façade covering for covering the outer wall of a building consist of a plurality of façade covering boards attached to the outer wall of the building, which are each designed as circuit boards.

The invention is based on the knowledge that the circuit boards common for producing electronic devices are extremely well suitable for covering façades of buildings, without requiring additional treatment of these circuit boards, for example with paint or varnish. Commercially available circuit boards have an aesthetically attractive surface structure, which is defined by conductive traces, metallized vias for receiving connecting wires or mounting elements of electronic devices and colored, frequently greenish-transparent insulating varnish layers.

The invention is further based on the knowledge that commercially available circuit boards do not only have the described optically attractive characteristics, but are also resistant against weather and environmental influences, without requiring further protective measures, such as an additional protective varnish layer.

The borings or vias typically provided in circuit boards for receiving connecting elements of electronic devices represent a desired porosity of the circuits, due to which the desired "breathing" of the area of an outer wall provided with such circuit boards is ensured.

Further design possibilities of the buildings provided with the inventive façade covering result from the fact that the circuit boards used as façade covering board can be provided with light-emitting diodes in order to enlighten the building façade even during the night.

BRIEF DESCRIPTION OF THE DRAWINGS

These and other objects and features of the present invention will become clear from the following description taken in conjunction with the accompanying drawings, in which:

The only FIGURE is a partial sectional view of a building wall provided with the inventive façade covering.

DESCRIPTION OF THE PREFERRED EMBODIMENTS

Figure 1:
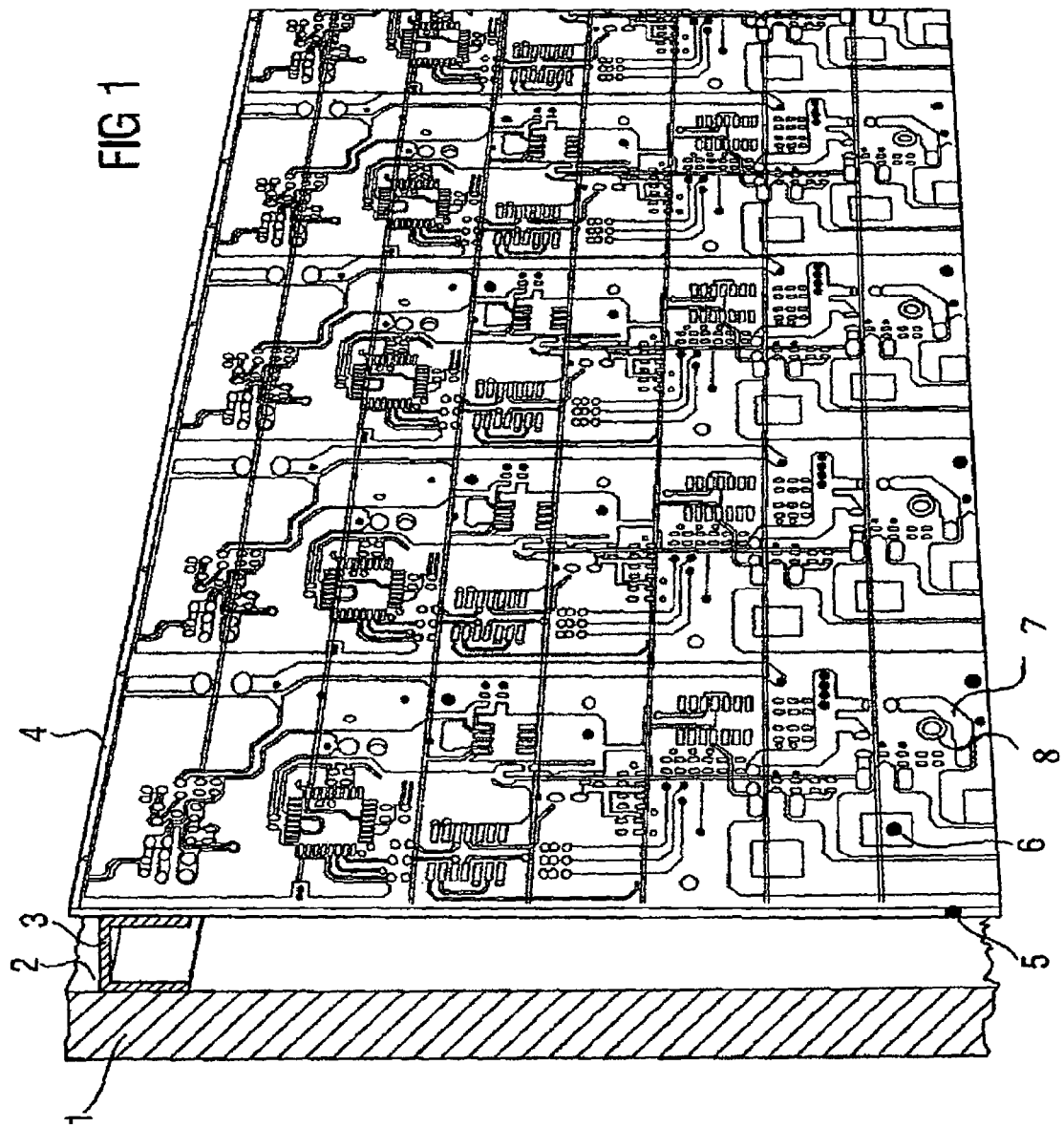

An outer wall 1 of a building shown in partial sectional view in the FIGURE, which can, for example, be configured as uncoated brick wall, is provided at its outside 2 with carrier profiles 3 having a U-shaped cross section, which consist, for example, of light metal.

While only a single carrier profile 3 is shown in the graphical illustration of the FIGURE, it is obvious for a person skilled in the art that the carrier profiles 3 are disposed on the outside 2 of the outer wall 1 in such intervals that at least always two carrier profiles 3 engage one circuit board, which is each designated by the reference number 4 in its entirety.

As it is common in the field of circuit board techniques, each of the printed circuit boards 4 consists of an epoxide carrier 5, at the main surface of which, which is directed towards the outside, a plurality of metallic structures 6 is provided, which typically extend between individual vias, which are formed for receiving connecting elements of electronic devices.

The circuit boards can be loaded with light-emitting diodes (not shown) or other appropriate light-emitting means at a plurality of locations, in order to implement façade illumination in this way.

The patterns of the façade surface resulting from the structures of the conductive traces 7, the vias 8 and the metallization regions of the surface of the circuit board 4 give the buildings provided with inventive façade covering an unusual striking appearance.

Due to the resistance of circuit boards against moisture and environmental influences, the positive appearance of the buildings provided with the inventive façade covering is maintained for years.

While this invention has been described in terms of several preferred embodiments, there are alterations, permutations, and equivalents, which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is

1. A façade covering comprising:
a portion of an exterior wall of a building; and
a plurality of façade covering boards mounted on the exterior wall portion so that the façade covering boards are at all times exposed to environmental elements and are substantially visually unencumbered by any other structures attached to the exterior wall portion,
wherein the façade covering boards are printed circuit boards, each printed circuit board having a visual pattern of conductive traces and comprising an epoxide carrier.

2. The façade covering according to claim 1, wherein the visual pattern of conductive traces are directed away from the building.

3. The façade covering according to claim 1, wherein the circuit boards have a plurality of vias, wherein the vias are suitable for receiving connecting elements of electronic devices.

4. The façade covering according to claim 1, wherein the least one of the circuit boards is loaded with light-emitting diodes.

5. A building outer wall covering, comprising:
a portion of an exterior wall of a building;
a plurality of façade covering printed circuit boards of an epoxide carrier covering the exterior wall portion; and
a mounting structure shaped to connect said covering boards to the exterior wall portion, wherein the covering boards are at all times exposed to environmental elements and are substantially visually unencumbered by any other structures attached to the exterior wall portion.

6. The covering according to claim 5, wherein said printed circuit boards have an outer surface directed away from said mounting structure and visible metallic conductive trace structures at said outer surface.

7. The covering according to claim 5, wherein said printed circuit boards have a plurality of electronic device connection vias.

8. The covering according to claim 5, wherein at least one of said printed circuit boards has a set of light-emitting diodes.

9. A building outer wall covering, comprising:
a portion of an exterior wall of a building;
a plurality of façade covering printed circuit boards of an epoxide carrier covering a part of the exterior wall portion, at least one of said covering boards having a set of light-emitting diodes;
a mounting structure shaped to connect said covering boards to the exterior wall portion and exposing the covering boards at all times to environmental elements, the covering boards being substantially visually unencumbered by any other structures attached to exterior wall portion; and
said covering boards having:
an outer surface directed away from said mounting structure;
a plurality of electronic device connection vias; and
metallic conductive trace structures at said outer surface.

* * * * *